(12) United States Patent
Shah et al.

(10) Patent No.: US 8,823,407 B2
(45) Date of Patent: Sep. 2, 2014

(54) TEST ASSEMBLY FOR VERIFYING HEAT SPREADER GROUNDING IN A PRODUCTION TEST

(75) Inventors: Jitesh A. Shah, Fremont, CA (US); Errol Monsale, Santa Clara, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 363 days.

(21) Appl. No.: 13/410,040

(22) Filed: Mar. 1, 2012

(65) Prior Publication Data

US 2013/0229201 A1 Sep. 5, 2013

(51) Int. Cl.
G01R 31/00 (2006.01)

(52) U.S. Cl.
USPC .................................. 324/756.01; 324/756.05

(58) Field of Classification Search
CPC .............. G01R 31/00–31/026; G01R 31/2853; G01R 31/2896; H01L 23/02–23/10; H01L 23/48–23/488
See application file for complete search history.

(56) References Cited

U.S. PATENT DOCUMENTS

| 6,097,203 | A | * | 8/2000 | Parker et al. | 324/750.27 |
| 6,430,043 | B1 | * | 8/2002 | Osburn | 361/679.54 |
| 7,453,157 | B2 | * | 11/2008 | Haba et al. | 257/785 |
| 7,968,999 | B2 | | 6/2011 | Celik et al. | |
| 2005/0242823 | A1 | * | 11/2005 | Parker | 324/530 |
| 2008/0090429 | A1 | * | 4/2008 | Mok et al. | 439/81 |

* cited by examiner

*Primary Examiner* — Vinh Nguyen
(74) *Attorney, Agent, or Firm* — Roeder & Broderup (57) ABSTRACT

A test assembly (12) for testing a device (10) having a heat spreader (20), a package substrate (18) having a substrate ground (18G), and a grounding conductive segment (44A), includes (i) an input conductive segment (38) that is electrically connected to the heat spreader (20), (ii) a test board (28) having a board ground (30), and (iii) a control system (34) that is electrically coupled to the input conductive segment (38) and the board ground (30). During testing, the device (10) is positioned so that the substrate ground (18G) is electrically connected to the board ground (30). Additionally, the control system (34) directs a test current to one of the input conductive segment (38) and the board ground (30) to test the effectiveness of the grounding conductive segment (44A) including a first electrical interface (45A).

20 Claims, 5 Drawing Sheets

TEST ASSEMBLY FOR VERIFYING HEAT SPREADER GROUNDING IN A PRODUCTION TEST

BACKGROUND

Heat spreaders are used to effectively dissipate large quantities of heat generated by high-power devices. In most applications, these heat spreaders (e.g., metal plates) are electrically floating, which generally enables the heat spreader to do its job of heat dissipation. However, when heat spreaders are implemented for devices sending and receiving data at high speeds, the floating metal starts to impact the electrical performance of the device. In particular, the conductors on the device may capacitively couple to the floating heat spreader, which can become an effective radiator of energy, causing electromagnetic interference to other circuitry on the system.

To prevent this, the device carrier can be designed so that the heat spreader is electrically connected to the system ground. By utilizing such means, any charges coupling to the metal plate, i.e. the heat spreader, are effectively shunted to ground, thereby inhibiting the potential for electromagnetic interference. Unfortunately, previous attempts to test the device to ensure that the heat spreader is properly grounded have been very difficult, inefficient, costly and/or time consuming.

SUMMARY

The present invention is directed to a test assembly for testing a device that includes a heat spreader, a package substrate having a substrate ground, and a grounding conductive segment that is designed to electrically connect the heat spreader to the substrate ground, the grounding conductive segment including a first electrical interface between the heat spreader and the package substrate. In certain embodiments, the test assembly comprises an input conductive segment, a test board, and a control system. The input conductive segment is electrically connected to the heat spreader. The test board has a board ground. During testing, the device is positioned so that the substrate ground is electrically connected to the board ground. The control system is electrically coupled to the input conductive segment and the board ground. Additionally, the control system directs a test current to one of the input conductive segment and the board ground to test the effectiveness of the grounding conductive segment including the first electrical interface.

In one embodiment, the device further includes a stiffener positioned substantially between the heat spreader and the package substrate. In such embodiment, the first electrical interface is between the heat spreader and the stiffener. Additionally, in such embodiment, the grounding conductive segment further includes a second electrical interface between the stiffener and the package substrate. Further, the control system directs a test current to one of the input conductive segment and the board ground to test the effectiveness of the grounding conductive segment including the first electrical interface and the second electrical interface.

In some embodiments, the test assembly further comprises a plurality of spaced apart board pins, including a board ground pin that is electrically connected to the board ground. In one such embodiment, during testing, the device is positioned so that the substrate ground is electrically connected to the board ground pin. Additionally, in such embodiments, the test assembly can further comprise an assembly body that is positioned substantially adjacent to the test board. The assembly body is adapted to receive the device. In one such embodiment, the board ground pin extends through the assembly body.

Additionally, in certain embodiments, the test assembly further comprises an assembly lid that is adapted to be pressed against the device. In one such embodiment, the input conductive segment includes a first conductive segment that is positioned substantially within the assembly lid. Further, the test assembly can further comprise the assembly body that is positioned substantially adjacent to the test board. The assembly body can be adapted to receive the device. In one embodiment, the input conductive segment further includes a second conductive segment that is positioned substantially within the assembly body. In such embodiment, the second conductive segment is electrically connected to the first conductive segment. Moreover, in one embodiment, input conductive segment further includes a third conductive segment that is positioned substantially adjacent to the test board. In such embodiment, the third conductive segment is electrically connected to the second conductive segment.

In one embodiment, the assembly lid is a conductive plate. Alternatively, in one embodiment, the assembly lid is a substantially non-conductive plate that includes a conductive path that comprises the first conductive segment. Stated another way, the assembly lid effectively comprises the first conductive segment regardless of whether the assembly lid is a conductive plate in its entirety or whether the assembly lid merely provides a single conductive path that is coupled between the control system and the heat spreader.

Further, in one embodiment, the control system measures the electrical connectivity of the test current to test the effectiveness of the grounding conductive segment including the first electrical interface.

Moreover, in one embodiment, the device includes an integrated circuit, and the control system further tests the functionality of the integrated circuit.

Additionally, the present invention is further directed to a method for testing a device that includes a heat spreader, a package substrate having a substrate ground, and a grounding conductive segment that is designed to electrically connect the heat spreader to the substrate ground, the grounding conductive segment including a first electrical interface between the heat spreader and the package substrate. In certain embodiments, the method comprises the steps of: (i) electrically connecting an input conductive segment to the heat spreader; (ii) positioning the device so that the substrate ground is electrically connected to a board ground of a test board; (iii) electrically coupling a control system to the input conductive segment and the board ground; and (iv) directing a test current to one of the input conductive segment and the board ground with the control system to test the effectiveness of the grounding conductive segment including the first electrical interface.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

As described in detail herein, the present invention describes a test assembly and method to verify the effectiveness of heat spreader grounding during a production test of a device. In order to effectively create such a test assembly and method, existing test fixtures are necessarily retooled and/or redesigned to facilitate a quick response to whether the heat spreader is properly grounded or not.

Figure 1A:
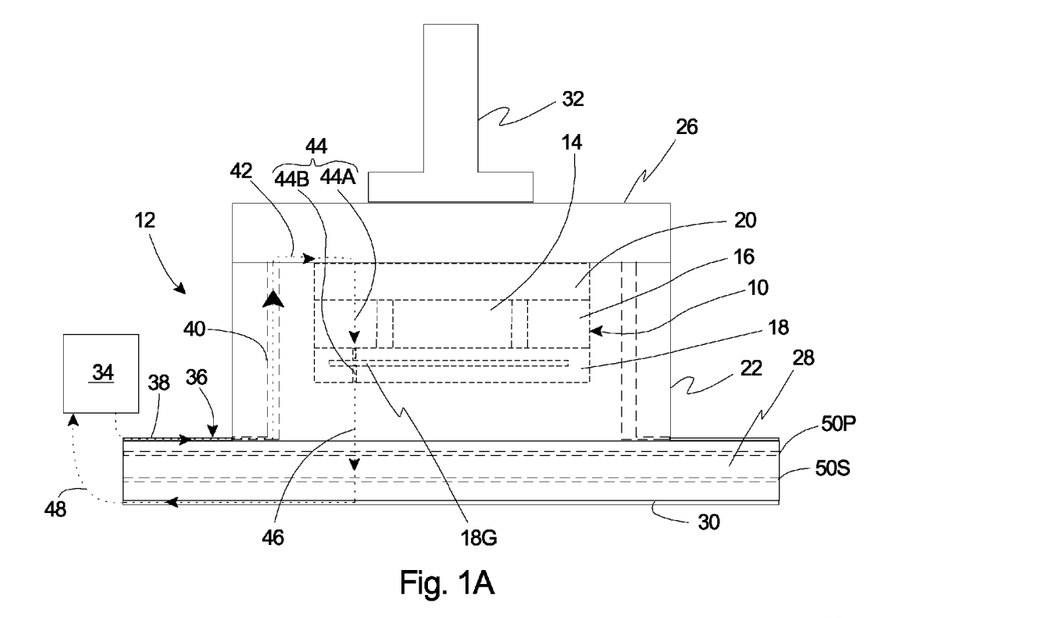
FIG. 1A is a simplified side view of a device and an embodiment of a test assembly having features of the present invention.

FIG. 1A is a simplified side view of a device 10 (illustrated in phantom) and an embodiment of a production test assembly 12 (also referred to herein simply as a "test assembly") having features of the present invention.

As will be discussed in greater detail herein below, in this embodiment, the device 10 includes an integrated circuit 14 (illustrated in phantom), a stiffener 16 (illustrated in phantom), a package substrate 18 (illustrated in phantom), and a heat spreader 20 (illustrated in phantom). Alternatively, the device 10 can have a different design. For example, in certain non-exclusive alternative embodiments, the device 10 can be designed without the stiffener 16, or the heat spreader 20 and the stiffener 16 can be integrally formed.

In certain embodiments, in addition to the grounding test described in detail herein below, the production tests performed with the test assembly 12 can evaluate additional features of the device 10. For example, the production tests performed with the test assembly 12 can evaluate various aspects of the functionality of the integrated circuit 14 and/or the device 10, such as the DC and AC performance of the device 10 at different process corners.

The design of the test assembly 12 can be varied. In the embodiment illustrated in FIG. 1A, the test assembly 12 includes (i) an assembly body 22 that defines an assembly cavity 24 (illustrated in FIG. 1D), (ii) an assembly lid 26, (iii) a test printed circuit board 28 (also referred to herein as a "test board") having a board ground 30, (iv) a mover 32 or handler, and (v) a control system 34.

As an overview, the test assembly 12 provides at least a portion of a conductive loop 36 (illustrated by dotted lines/arrows) that is electrically coupled to the control system 34 to test whether the heat spreader 20 is effectively grounded, i.e. by testing whether the heat spreader 20 is effectively electrically coupled to the board ground 30 in the test board 28. In particular, in this embodiment, the conductive loop 36 includes (i) a first conductive segment 38 electrically coupled to the control system 34 and positioned near, within and/or substantially adjacent to the test board 28; (ii) a second conductive segment 40 (e.g., a conductor pin) positioned near, within and/or substantially adjacent to the assembly body 22, the second conductive segment 40 electrically connecting and extending between the first conductive segment 38 and the assembly lid 26; (iii) a third conductive segment 42 positioned substantially adjacent to and/or within the assembly lid 26 and that electrically connects and extends from the second conductive segment 40 to the heat spreader 20 of the device 10; (iv) a fourth conductive segment 44 (also referred to as a "device conductive segment") that extends through the device 10 from the heat spreader 20 through the package substrate 18, the fourth conductive segment 44 including a first electrical interface 45A (illustrated in FIG. 1E) between the heat spreader 20 and the stiffener 16, and a second electrical interface 45B (illustrated in FIG. 1E) between the stiffener 16 and the package substrate 18; (v) a fifth conductive segment 46 that electrically connects and extends from the package substrate 18 of the device 10, i.e. from the device conductive segment 44, to the board ground 30 of the test board 28; and (vi) a sixth conductive segment 48 (e.g., a conductive coupling) that electrically couples the board ground 30 of the test board 28 and the control system 34.

In one embodiment, during a production test of the device 10, current is supplied from the control system 34 and through the conductive loop 36 (e.g., to one of the first conductive segment 38 or to the board ground 30), and the electrical connectivity, e.g., the resistance, within the conductive loop 36 is measured. If the conductive loop 36 exhibits poor electrical connectivity, e.g., experiences high resistance, then the heat spreader 20 is determined to be not effectively grounded; however, if the conductive loop 36 exhibits strong electrical connectivity, e.g., experiences low resistance, then the heat spreader 20 is determined to be effectively grounded. For example, in one embodiment, if the conductive loop 36 has a resistance that is equal to or greater than a predetermined resistance threshold, then the heat spreader 20 is determined to be ineffectively grounded and the device 10 fails this production test. Alternatively, if the conductive loop 36 has a resistance that is less than the predetermined resistance threshold, then the heat spreader 20 is determined to be effectively grounded and the device 10 passes this production test.

Additionally and/or alternatively, the effectiveness of the grounding of the heat spreader 20 can be tested utilizing the test assembly 12 as illustrated and described herein by focusing on electrical connectivity parameters of the conductive loop 36 other than the resistance.

As utilized herein, the device conductive segment 44 includes a grounding conductive segment 44A that extends from and electrically connects the heat spreader 20 to a substrate ground 18G (illustrated in phantom), and a substrate conductive segment 44B that electrically connects the substrate ground 18G to the fifth conductive segment 46.

With the present design, the effectiveness of the grounding of the heat spreader 20, i.e. the effectiveness and integrity of the fourth conductive segment 44, can be tested during a production test of the device 10 in a manner that is relatively easy, and that is not costly and/or time consuming to perform. It should be noted that the primary focus of the testing of the fourth conductive segment 44 is on the grounding conductive segment 44A, i.e. on the connectivity of the interfacing between the heat spreader 20 and the stiffener 16 and between the stiffener 16 and the package substrate 18. For example, in one embodiment, the testing of the grounding of the heat spreader 20 focuses on the testing of the conductivity and the quality of adhesion of the first electrical interface 45A between the heat spreader 20 and the stiffener 16, and the conductivity and the quality of the adhesion of the second electrical interface 45B between the stiffener 16 and the package substrate 18. For this reason, the grounding segment 44A may also be referred to as the "tested segment".

As shown in the embodiment illustrated in FIG. 1A, the electrical connections between the heat spreader 20 and the package substrate 18, i.e. the grounding conductive segment 44A, extend through and/or is achieved through the stiffener 16 and the connections between the stiffener 16 and the heat spreader 20 (i.e. the first electrical interface 45A) and between the stiffener 16 and the package substrate 18 (i.e. the second electrical interface 45B). Alternatively, in an embodiment that does not include a stiffener 16, the desired electrical connection is established more directly via the connection between the heat spreader 20 and the package substrate 18.

It should be noted that the use of the terms "first conductive segment", "second conductive segment", "third conductive segment", "fourth conductive segment", "fifth conductive segment" and "sixth conductive segment" is merely for ease of description and any of the conductive segments 38, 40, 42, 44, 46, 48 can be referred to as the "first", "second", "third", "fourth", "fifth" or "sixth". Additionally, one or more of the conductive segments 38, 40, 42, 44, 46, 48 can be combined without altering the intended scope and breadth of the present invention. For example, in certain embodiments, the first conductive segment 38, the second conductive segment 40 and the third conductive segment 42 can be referred to individually or in combination as "input conductive segments" or "the input conductive segment". Moreover, one or more of the conductive segments 38, 40, 42, 44, 46, 48 can be eliminated and/or additional conductive segments can be added without altering the intended scope and breadth of the present invention. For example, in one non-exclusive alternative embodiment, the conductive loop 36 does not include the first conductive segment 38 or the second conductive segment 40, and the control system 34 can be more directly electrically coupled to the assembly lid 26.

Additionally, it should be noted that the use of the terms "first electrical interface" and "second electrical interface" is merely for ease of description, and either of the electrical interfaces 45A, 45B can be referred to as the "first electrical interface" and/or the "second electrical interface".

The assembly body 22 is positioned substantially adjacent to the test board 28 and is adapted to receive the device 10. In this embodiment, the assembly body 22 is substantially rectangular box shaped, such that the device 10 can be positioned within the assembly body 22, i.e. within the assembly cavity 24, during a production test (including a grounding test) of the device 10. Alternatively, the assembly body 22 can have a different design and/or a different shape. For example, the assembly body 22 can be substantially circle-shaped, square-shaped, triangle-shaped, hexagon-shaped, octagon-shaped, or some other shape.

Additionally, the assembly body 22 can include, guide and/or incorporate the second conductive segment 40 of the conductive loop 36. In one embodiment, the second conductive segment 40 can comprise a conductor pin that extends substantially through the assembly body 22 between the test board 28 and the assembly lid 26. Further, in one embodiment, the second conductive segment 40, e.g., the conductor pin, can be made of a copper material. Alternatively, the second conductive segment 40, e.g., the conductor pin, can be made of a different conductive material. Still alternatively, the second conductive segment 40 can have a different design that provides the electrical connection between the first conductive segment 38 and the assembly lid 26.

In the embodiment illustrated in FIG. 1A, the assembly lid 26 is substantially rectangular plate shaped. Additionally, in this embodiment, the assembly lid 26 is a conductive plate that is pressed against (i) the second conductive segment 40, i.e. the conductor pin, in the assembly body 22, and (ii) the device 10, e.g., against the heat spreader 20, during production testing (including grounding testing). With this design, the assembly lid 26 includes, incorporates and/or provides the third conductive segment 42, which, as noted above, provides the electrical connection between the second conductive segment 40 and the heat spreader 20 of the device 10. Alternatively, the assembly lid 26 can have a different design and/or a different shape. For example, the assembly lid 26 can be substantially circle-shaped, square-shaped, triangle-shaped, hexagon-shaped, octagon-shaped, or some other shape. Still alternatively, the assembly lid 26 can be designed to merely provide a conductive path within an otherwise non-conductive plate in order to effectively provide the third conductive segment 42 of the conductive loop 36 between the second conductive segment 40 and the heat spreader 20 of the device 10.

The test board 28 provides the necessary means for conducting the production testing on the device 10. For example, in one embodiment, the test board 28 is a circuit board that includes a flat board that is made of non-conducting material (e.g., an insulating material), and a plurality of predefined conductive metal pathways that are printed on the surface of the board. Additionally, as illustrated, the test board 28 can also include a power rail 50P (illustrated in phantom), a signal rail 50S (illustrated in phantom), and the board ground 30, e.g., a ground plane. The power rail 50P, the signal rail 50S and the board ground 30 can be used to test various aspects of the functionality of the integrated circuit 14 and/or additional features of the device 10, and the board ground 30 can further be used to test the effectiveness of the grounding of the heat spreader 20. Moreover, the board ground 30, as part of its use in the grounding testing, provides the link from the fifth conductive segment 46 to the sixth conductive segment 48 of the conductive loop 36. With this design, during a normal production test of the functionality of the device 10, the device 10 can further be tested to ensure that the heat spreader 20 is properly connected to ground, i.e. is properly grounded, to thereby inhibit any unwanted electromagnetic interference from negatively impacting the performance of the device 10.

The mover 32 moves and positions the device 10 within the assembly body 22, i.e. within the assembly cavity 24, so that the necessary production and grounding testing can be conducted. Additionally, the mover 32 moves and presses the assembly lid 26 on top of the assembly body 22 (i.e. against the second conductive segment 40) and against the device 10, i.e. against the heat spreader 20, during the testing procedures in order that the conductive loop 36 can be successfully completed. Moreover, the mover 32 urges the device 10 against a portion of the test assembly 12, e.g., against a portion of the assembly body 22 and/or the test board 28, to enable the necessary electrical and/or mechanical connections in order to successfully complete the conductive loop 36. Further, the mover 32 removes the device 10 from the assembly cavity 24 upon completion of testing. In different embodiments, the mover 32 can be operated automatically or manually to perform its necessary functions.

The control system 34 is electrically connected to the remainder of the test assembly 12 to enable the proper production testing and grounding testing of the device 10. More particularly, the control system 34 is electrically connected to the assembly body 22, the assembly lid 26, the test board 28 and/or the mover 32 to enable the proper production testing and grounding testing of the device 10. For purposes of grounding testing, in one embodiment, the control system 34 provides the necessary link between the sixth conductive segment 48 and the first conductive segment 38 within the conductive loop 36. Stated another way, the control system 34 provides the electrical connection between the board ground 30 of the test board 28 and the first conductive segment 38 that is positioned near, within and/or substantially adjacent to the test board 28. Moreover, the control system 34 directs a test current to one of the first conductive segment 38 and the board ground 30 to enable the proper production testing and grounding testing of the device 10. As illustrated, the control system 34 is spaced apart from the test board 28. Alternatively, the control system 34 can be directly mechanically coupled to the test board 28.

Figure 1B:
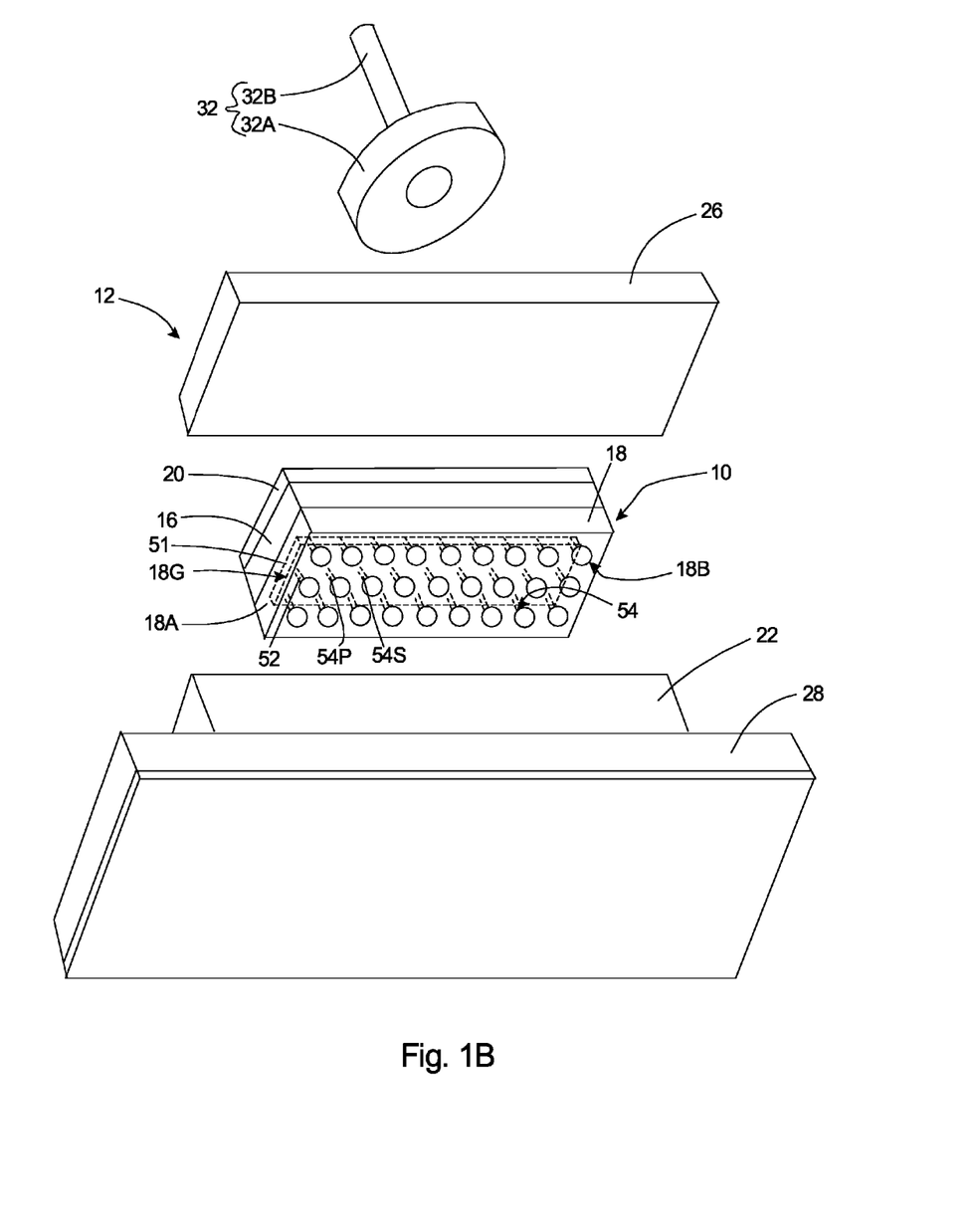
FIG. 1B is a partially exploded perspective view of the device and the test assembly illustrated in FIG. 1A.

FIG. 1B is a partially exploded perspective view of the device 10 and the test assembly 12 illustrated in FIG. 1A. In particular, FIG. 1B illustrates the assembly body 22, the assembly lid 26, the test board 28, the mover 32, and the device 10.

As illustrated in FIG. 1B, the mover 32 can include a circular, disk portion 32A and a cylinder-shaped shaft portion 32B. In one embodiment, the disk portion 32A and the shaft portion 32B are integrally formed as a unitary structure. Moreover, in certain embodiments, the mover 32 can include one or more features that enable the mover 32 to selectively pick up, move and position the device 10 and/or the assembly lid 26 for proper production testing and grounding testing of the device 10. For example, in one embodiment, the mover 32 can include a vacuum feature that enables the mover 32 to selectively pick up, move and position the device 10 and/or the assembly lid 26. Alternatively, the mover 32 can have a different design and/or a different shape.

Additionally, FIG. 1B illustrates certain details of the device 10. For example, FIG. 1B illustrates certain features of the stiffener 16, the package substrate 18 and the heat spreader 20.

Figure 1C:
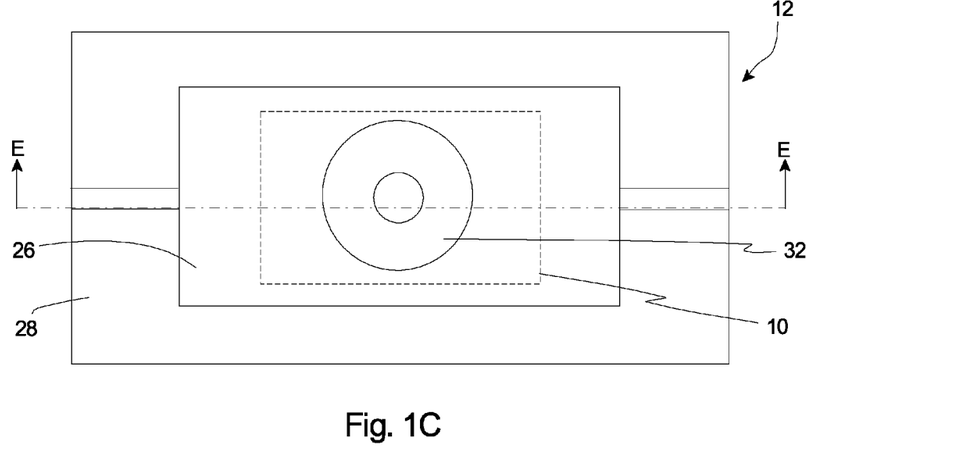
FIG. 1C is a simplified top view of the device and the test assembly illustrated in FIG. 1A.
Figure 1D:
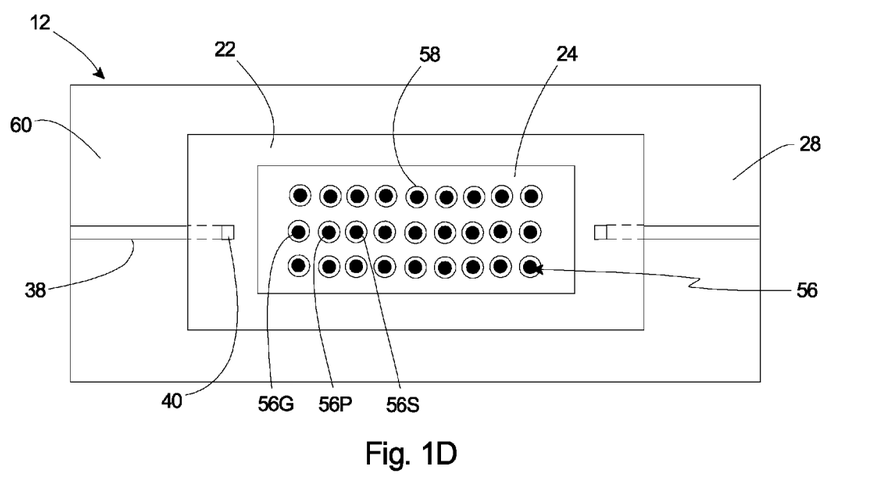
FIG. 1D is a simplified top view of a portion of the test assembly illustrated in FIG. 1A.
Figure 1E:
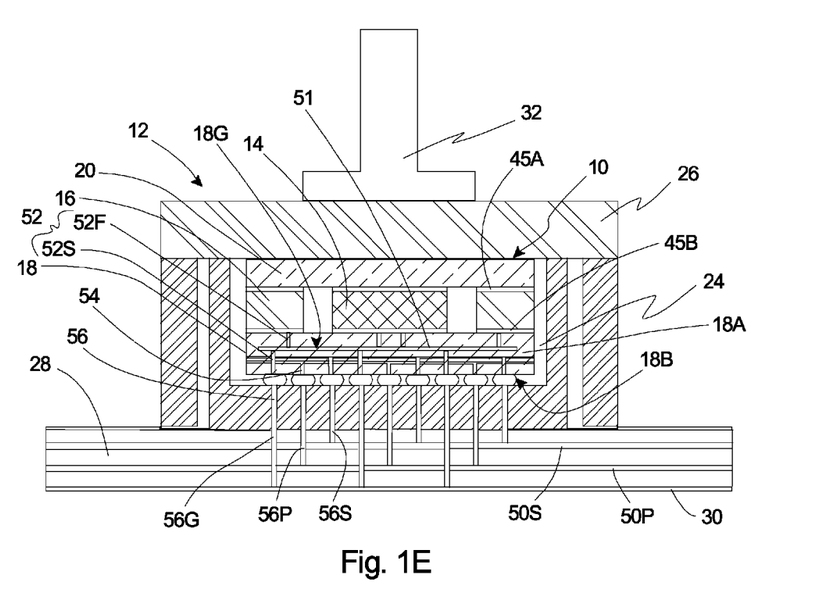
FIG. 1E is a sectional view of the device and the test assembly taken on line E-E in FIG. 1C.

In this embodiment, the stiffener 16 is substantially rectangular ring shaped and is positioned substantially between and is electrically connected to the package substrate 18 (via the second electrical interface 45B (illustrated in FIG. 1E)) and the heat spreader 20 (i.e. via the first electrical interface 45A (illustrated in FIG. 1E). The stiffener 16 provides stiffness to the device 10 so that the device 10 can be moved with reduced risk of damage to the device 10, e.g., to the integrated circuit 14 (illustrated in FIG. 1A) of the device 10.

Additionally, the stiffener 16 is made of an electrically conductive material. For example, in one embodiment, the stiffener 16 can be made of a copper material. Alternatively, the stiffener 16 can be made of a different metal or another suitable material.

In this embodiment, the package substrate 18 is secured to and/or positioned adjacent to a bottom surface of the stiffener 16 via the second electrical interface 45B. Additionally, the package substrate 18 electrically and mechanically couples the integrated circuit 14 to the test board 28 during production and grounding testing of the device 10. The design of the package substrate 18 can be varied. In the embodiment illustrated in FIG. 1B, the package substrate 18 includes a substrate body 18A and a pinout 18B.

As shown, the substrate body 18A is substantially rectangle-shaped and has an outer perimeter that is coincident with an outer perimeter of the stiffener 16. Alternatively, the substrate body 18A can have a different shape. In certain embodiments, the substrate body 18A can include one or more conductive layers (not illustrated), one or more insulating layers (not illustrated), the substrate ground 18G (including a ground layer 51 (illustrated in phantom) and/or one or more ground vias 52 (illustrated in phantom)) and a plurality of non-ground vias 54 (illustrated in phantom). In some embodiments, the non-ground vias 54 can include power vias 54P and signal vias 54S. The design and number of each of these components can be varied to achieve the design requirements of the package substrate 18 and/or the device 10.

The conductive layers and the non-ground vias 54 provide an electrical and mechanical connection between the integrated circuit 14 and the pinout 18B. Additionally, the substrate ground 18G, including the ground layer 51 and/or one or more ground vias 52, provides an electrical and mechanical connection between the stiffener 16 and the pinout 18B and between the integrated circuit 14 and the pinout 18B. With this design, the conductive layers, the non-ground vias 52, and the system ground 18G enable the proper production testing of the device 10. The conductive material used in the conductive layers can vary. For example, one suitable material for the conductive layers is copper.

The insulating layers mechanically and electrically separate the conductive layers. The insulating material used in the insulating layers can vary. Suitable materials for the insulating layers include dielectrics, such as glass epoxy.

As provided above, the system ground 18G can include the ground layer 51 and/or one or more ground vias 52. For example, as illustrated in FIG. 1B, the system ground 18G can include both the ground layer 51 and one or more ground vias 52. In such embodiment, the ground vias 52 can include a first (or upper) ground via 52F (illustrated in FIG. 1E) that extends from the top of the substrate body 18A to the ground layer 51, and a second (or lower) ground via 52S (illustrated in FIG. 1E) that extends from the ground layer 51 to the bottom of the substrate body 18A, e.g., to the pinout 18B. Alternatively, the system ground 18G can be designed without the ground layer 51, and the one or more ground vias 52 can extend fully from the top to the bottom of the substrate body 18A. A suitable conductive material for the ground vias 52 is copper.

In one embodiment, one or more of the ground vias 52 can extend between and electrically connect the stiffener 16 and the ground layer 51. Additionally, in one embodiment, one or more of the ground vias 52 can extend between and electrically connect the integrated circuit 14 with the ground layer 51. Further, in one embodiment, one or more of the ground vias 52 can extend between and electrically connect the ground layer 51 with the pinout 18B.

The non-ground vias 54 are formed in the insulating layers and can extend between and electrically connect any of the conductive layers. Additionally, the non-ground vias 54 can extend between and electrically connect the integrated circuit 14 with the conductive layers, and the conductive layers with the pinout 18B.

With this design, the non-ground vias 54 and the ground vias 52 can be utilized to enable the proper functionality of the integrated circuit 14. Moreover, the non-ground vias 54 and the ground vias 52 can be strategically arranged to reduce crosstalk and/or to improve signal timing margins. A suitable conductive material for the non-ground vias 54 is copper.

The pinout 18B provides the interface for electrically and mechanically coupling the substrate body 18A to the test board 28 during production and grounding testing of the device 10. In one non-exclusive embodiment, the pinout 18B can include a ball grid array that electrically and mechanically couples the package substrate 18 to the test board 28. Moreover, in one embodiment, the pinout 18B can include and/or incorporate a plurality of solder balls (or solder bumps) that further enhance the electrical and mechanical coupling between the package substrate 18 and the test board 28.

It should be noted that the size of the pinout 18B illustrated in FIG. 1B is merely for the purposes of reference and ease of illustration, and it is not intended to represent the actual size of the pinout 18B.

The heat spreader 20 is positioned substantially adjacent to the integrated circuit 14 to dissipate heat that is generated during the operation of the device 10. For example, the heat spreader 20 can be a thermally conductive plate, e.g., a copper plate, that is physically connected to the integrated circuit 14. Additionally, to inhibit the potential for electromagnetic interference from negatively impacting the performance of the integrated circuit 14, the heat spreader 20 is adapted to be grounded within and/or through the package substrate 18.

In this embodiment, the heat spreader 20 is substantially rectangle shaped and is secured and/or positioned adjacent to a top surface of the stiffener 16 via the first electrical interface 45A. Additionally, as shown, the heat spreader 20 has an outer perimeter that is coincident with the outer perimeter of the stiffener 16 and the outer perimeter of the substrate body 18A. Alternatively, the heat spreader 20 can have a different design and/or a different shape.

FIG. 1C is a simplified top view of the device 10 (illustrated in phantom) and the test assembly 12 illustrated in FIG. 1A. In particular, FIG. 1C illustrates the test assembly 12 with the assembly lid 26 positioned on top of the assembly body 22 (illustrated in FIG. 1A) by the mover 32 above the test board 28. Additionally, in FIG. 1C, the device 10 is positioned within the assembly body 22, i.e. within the assembly cavity 24 (illustrated in FIG. 1D), for purposes of production and grounding testing of the device 10.

FIG. 1D is a simplified top view of a portion of the test assembly 12 illustrated in FIG. 1A. In particular, FIG. 1D illustrates the assembly body 22 and the test board 28.

As noted above, in this embodiment, the assembly body 22 is substantially rectangle-shaped, although other shapes may also be used. Additionally, as provided above, the assembly body 22 defines the assembly cavity 24, which receives the device 10 (illustrated in FIG. 1A) during production and grounding testing of the device 10. In this embodiment, the assembly cavity 24 that is defined by the assembly body 22 is also substantially rectangle-shaped. Alternatively, the assembly cavity 24 can have a different shape. For example, the assembly cavity 24 can be substantially circle-shaped, square-shaped, triangle-shaped, hexagon-shaped, octagon-shaped, or some other shape.

As illustrated in FIG. 1D, extending at least partially through the assembly body 22 are a plurality of spaced apart board pins 56, such that each board pin 56 is adapted to electrically and mechanically connect to one of the vias 52, 54 (illustrated in FIG. 1B). Further, the board pins 56 can include one or more of board power pins 56P, board signal pins 56S and board ground pins 56G that are adapted to electrically and mechanically connect to the power vias 54P (illustrated in FIG. 1B), the signal vias 54S (illustrated in FIG. 1B), and the ground vias 52 (illustrated in FIG. 1B), respectively. With this design, the heat spreader 20 (illustrated in FIG. 1A) can be properly electrically connected to the board ground 30 (illustrated in FIG. 1A) and the integrated circuit 14 (illustrated in FIG. 1A) can be properly electrically connected to the test board 28 for necessary and appropriate production testing and grounding testing of the device 10.

Additionally, the assembly body 22 can further include one or more indentations 58 or apertures, such that each indentation 58 is adapted to receive and/or engage one of the vias 52, 54 or one of the solder balls from the pinout 18B (illustrated in FIG. 1B). Moreover, each of the board pins 56 can incorporate one of the indentations 58 and/or can extend in a generally downward direction from one of the indentations 58. With this design, when the device 10 is positioned within the assembly cavity 24 during production and grounding testing of the device 10, each of the vias 52, 54 can easily be positioned to be coupled to one of the board pins 56 within one of the indentations 58, thus enabling the electrical and mechanical connection of the device 10 to the test assembly 12.

It should be noted that the number of board pins 56 and the number of indentations 58 illustrated in FIG. 1D is merely for the purposes of reference and ease of illustration, and it is not intended to represent the actual number of board pins 56 or indentations 58 that may be included within the test assembly 12. For example, the test assembly 12 may include a greater number of board pins 56 and indentations 58 than that illustrated in FIG. 1D.

Additionally, FIG. 1D also illustrates a portion of the first conductive segment 38 and a portion of the second conductive segment 40. In one embodiment, the first conductive segment 38 can include a segment or strip of conductive material, e.g., a segment of copper material or another suitable material, that is positioned on, near and/or adjacent to an upper surface 60 of the test board 28. Alternatively, the first conductive segment 38 can have a different design.

Further, in one embodiment, as provided above, the second conductive segment 40 can include and/or comprise a conductor pin that is positioned substantially within the assembly body 22. Moreover, as noted above, the second conductive segment 40 electrically connects and extends between the first conductive segment 38 and the assembly lid 26 (illustrated in FIG. 1A). In one embodiment, the second conductive segment 40 can be formed from conductive material, e.g., copper material or another suitable material. Alternatively, the second conductive segment 40 can have a different design.

FIG. 1E is a sectional view of the device 10 and the test assembly 12 taken on line E-E in FIG. 1C. In particular, FIG. 1E illustrates additional features of the device 10 and the connections between the device 10 and the test assembly 12.

The design of the device 10 can be varied. As provided above, in this embodiment, the device 10 includes the integrated circuit 14, the stiffener 16, the package substrate 18, and the heat spreader 20.

The integrated circuit 14 consists of a number of circuit elements positioned on a chip of silicon crystal or other semiconductor material. The design of the integrated circuit 14 can be varied. For example, the integrated circuit 14 can be a flip type chip as illustrated in FIG. 1E, or a wire bond type chip.

As illustrated in FIG. 1E, the integrated circuit 14 is positioned substantially between the package substrate 18 and the heat spreader 20. Additionally, the integrated circuit 14 can be fixedly secured to the package substrate 18 and the heat spreader 20 with adhesive material, such as a conductive glue. Further, as illustrated, the integrated circuit 14 is positioned substantially within and spaced apart from the ring-shaped stiffener 16.

Additionally, as provided above, the stiffener 16 is substantially rectangular ring shaped and is positioned substantially between the package substrate 18 and the heat spreader 20. Moreover, in certain embodiments, the stiffener 16 can be fixedly secured to the heat spreader 20 via the first electrical interface 45A, and the stiffener 16 can be fixedly secured to the package substrate 18 via the second electrical interface 45B. In one embodiment, each of the first electrical interface 45A and the second electrical interface 45B can be formed of a substantially adhesive material such as a conductive glue, or another suitable conductive adhesive material.

With the design of the device 10 as provided herein, for example, the heat spreader 20 is electrically connected to the pinout 18B of the package substrate 18 via the stiffener 16, the electrical interfaces 45A, 45B, and the substrate ground 18G within the substrate body 18A.

Further, as noted above, FIG. 1E also more clearly illustrates the electrical and mechanical connection between the device 10 and the test assembly 12 that is created via the pinout 18B, the ground vias 52 (e.g., the first ground via 52F and the second ground via 52S) and the non-ground vias 54, and the board pins 56. When the device 10 is appropriately positioned within the assembly cavity 24 of the test assembly 12, the vias 52, 54 are accurately coupled to the corresponding board pins 56 so as to ensure a proper electrical and mechanical connection between the device 10 and the test assembly 12. Further, with the mover 32 pressing down on the assembly lid 26, and, thus, indirectly pressing down on the device 10, the necessary connection between the vias 52, 54 and the board pins 56 can be effectively maintained throughout the testing procedure. Moreover, as shown in FIG. 1E, one or more of the ground board pins 56G is connected downward to the board ground 30 of the test board 28. With this design, the necessary electrical and mechanical connections are created to enable the heat spreader 20 to be effectively tested to ensure that it is properly grounded. Stated another way, with this design, the effectiveness of the grounding conductive segment 44A (illustrated in FIG. 1A), e.g., the electrical interfaces 45A, 45B, can be tested.

Additionally, as illustrated, one or more of the board power pins 56P can connect downward to the power rail 50P, and one or more of the board signal pins 56S can connect downward to the signal rail 50S, as well as one or more of the board ground pins 56G can connect downward to the board ground 30. With this design, the test assembly 12 can be utilized to test various aspects of the functionality of the integrated circuit 14 and/or additional features of the device 10.

Figure 2:
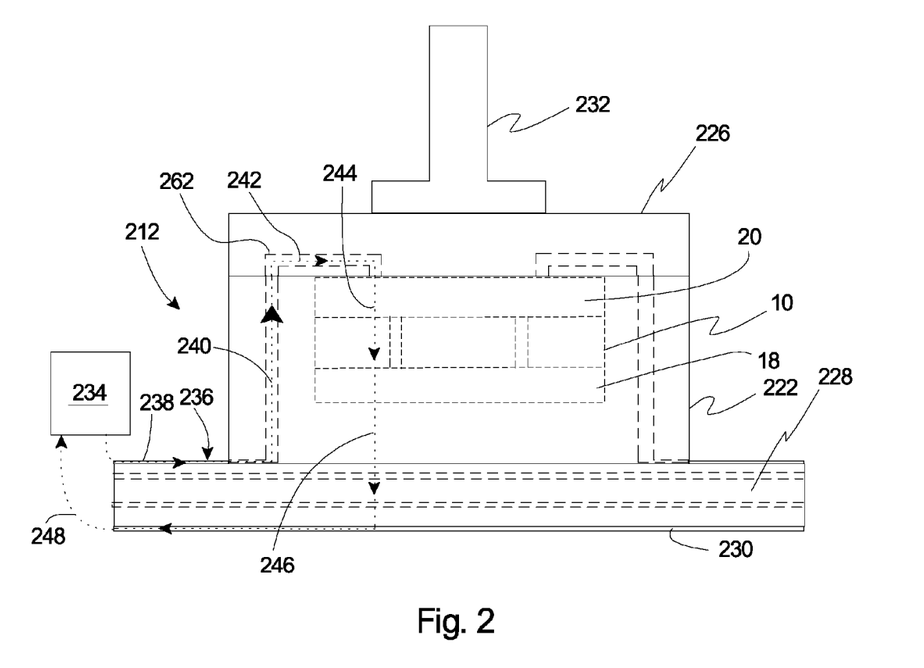
FIG. 2 is a simplified side view of the device and another embodiment of a test assembly having features of the present invention.

FIG. 2 is a simplified side view of the device 10 and another embodiment of a test assembly 212 having features of the present invention. The test assembly 212 is somewhat similar to the test assembly 12 illustrated and described above in relation to FIGS. 1A-1E. For example, the test assembly 212 includes an assembly body 222, a test printed circuit board 228 (also referred to herein as a "test board"), a mover 232 or handler, and a control system 234 that are substantially similar to the assembly body 22, the test board 28, the mover 32, and the control system 34 described above.

Additionally, the test assembly 212 again provides at least a portion of a conductive loop 236 (illustrated by dotted lines/arrows) that is electrically coupled to the control system 234 to test whether the heat spreader 20 (illustrated in phantom) of the device 10 is effectively grounded, i.e. by testing whether the heat spreader 20 is effectively electrically connected to a board ground 230 in the test board 228. In particular, in this embodiment, the conductive loop 236 again includes (i) a first conductive segment 238 electrically coupled to the control system 234 and positioned near, within and/or substantially adjacent to the test board 228; (ii) a second conductive segment 240 (e.g., a conductor pin) positioned near, within and/or substantially adjacent to the assembly body 222, the second conductive segment 240 electrically connecting and extending between the first conductive segment 238 and the assembly lid 226; (iii) a third conductive segment 242 positioned substantially adjacent to and/or within the assembly lid 226 and that electrically connects and extends from the second conductive segment 240 to the heat spreader 20 of the device 10; (iv) a fourth conductive segment 244 (a "device conductive segment") that extends through the device 10 from the heat spreader 20 through the package substrate 18 (illustrated in phantom), the fourth conductive segment 244 including the first electrical interface 45A (illustrated in FIG. 1E) between the heat spreader 20 and the stiffener 16, and the second electrical interface 45B (illustrated in FIG. 1E) between the stiffener 16 and the package substrate 18; (v) a fifth conductive segment 246 that electrically connects and extends from the package substrate 18 of the device 10, i.e. from the device conductive segment 244, to the board ground 230 of the test board 228; and (vi) a sixth conductive segment 248 (e.g., a conductive coupling) that electrically couples the board ground 230 of the test board 228 and the control system 234. Alternatively, the conductive loop 236 can have a different design. For example, in one non-exclusive alternative embodiment, the conductive loop 236 does not include the first conductive segment 238 or the second conductive segment 240 and the control system 234 can be more directly electrically coupled to the assembly lid 226.

However, in this embodiment, the assembly lid 226 is somewhat different than the assembly lid 26 illustrated and described above in relation to FIGS. 1A-1E. Similar to the previous embodiment, in the embodiment illustrated in FIG. 2, the assembly lid 226 is again substantially rectangular plate shaped, and the assembly lid 226 is again pressed against the second conductive segment 240 and the device 10 during production and grounding testing. In contrast to the previous embodiment, however, the assembly lid 226 is primarily a non-conductive plate that includes a conductive path 262 or band to provide the third conductive segment 242, which, as noted above, provides the electrical connection between the second conductive segment 240 and the heat spreader 20 of the device 10. Alternatively, the assembly lid 226 can have a different design and/or a different shape. For example, the assembly lid 226 can be substantially circle-shaped, square-shaped, triangle-shaped, hexagon-shaped, octagon-shaped, or some other shape.

Figure 3:
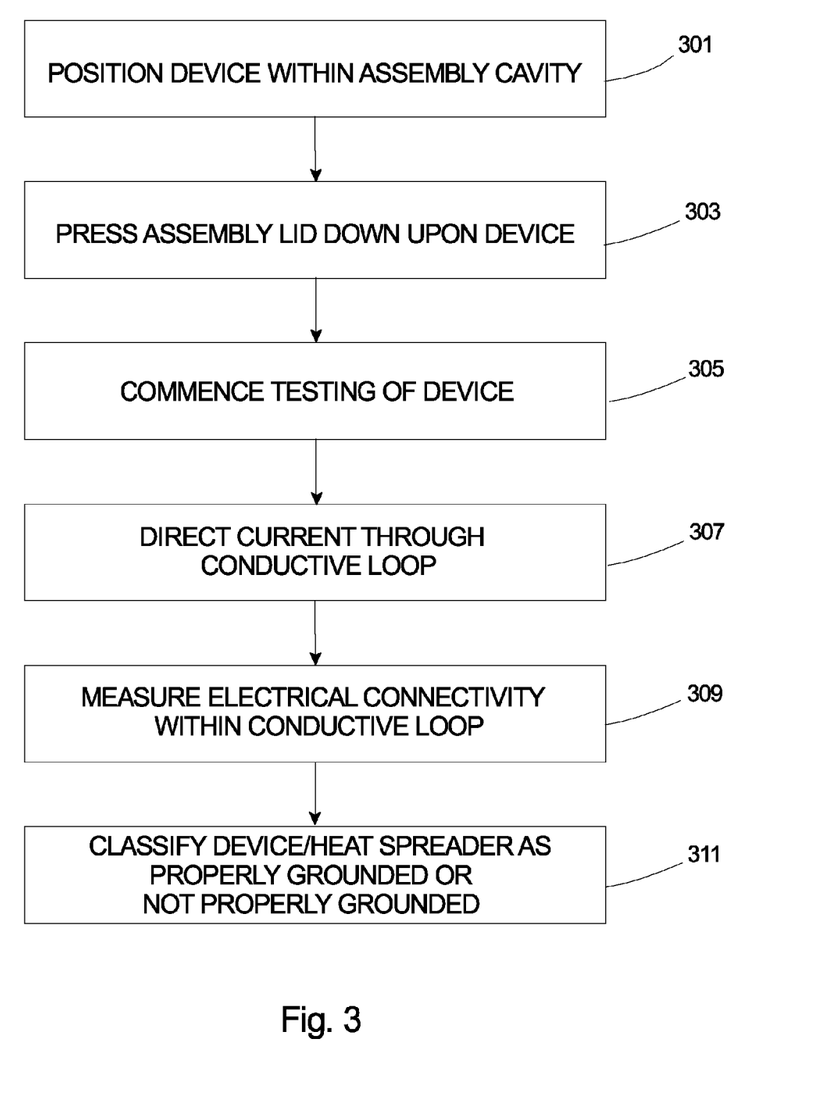
FIG. 3 is a simplified flow chart illustrating a method of testing the grounding of a heat spreader that is connected to a device during a production test.

FIG. 3 is a simplified flow chart illustrating a method of testing the grounding of a heat spreader that is connected to a device during a production test utilizing a test assembly as described above. Initially, in step 301, the mover is utilized to pick up a device and position the device within the assembly cavity that is defined by the assembly body. Proper positioning of the device requires that the substrate ground of the package substrate be electrically connected to the board ground of the test board. In one embodiment, this proper positioning requires that the non-ground vias and the ground vias of the device, i.e. the non-ground vias and the ground vias of the package substrate, be positioned so as to establish the necessary electrical connection with the board pins that form a part of the test assembly. In step 303, the mover picks up the assembly lid and presses the assembly lid down upon the device. More particularly, the mover presses the assembly lid down upon the heat spreader of the device. The pressure created between the assembly lid and the device ensures that proper contact and electrical connection is established and maintained between the substrate ground of the package substrate and the board ground of the test board, e.g., through the vias of the package substrate and the board pins of the test assembly.

With the device properly positioned within the assembly cavity, in step 305, the testing of the device, i.e. the production and/or grounding testing of the device, commences. To conduct the necessary grounding testing to ensure that the heat spreader is properly grounded, in step 307, current is directed through the conductive loop by the control system. Subsequently, in step 309, the control system measures the electrical connectivity, e.g., the resistance, within the conductive loop. Finally, in step 311, the device and/or the heat spreader is classified as properly and appropriately grounded based on established criteria.

While a number of exemplary aspects and embodiments of a test assembly 12 have been shown and disclosed herein above, those of skill in the art will recognize certain modifications, permutations, additions and sub-combinations thereof. It is therefore intended that the test assembly 12 shall be interpreted to include all such modifications, permutations, additions and sub-combinations as are within their true spirit and scope, and no limitations are intended to the details of construction or design herein shown.

What is claimed is:

1. A test assembly for testing a device that includes a heat spreader, a package substrate having a substrate ground, and a grounding conductive segment that is designed to electrically connect the heat spreader to the substrate ground, the grounding conductive segment including a first electrical interface between the heat spreader and the package substrate, the test assembly comprising:
   an input conductive segment that is electrically connected to the heat spreader;
   a test board having a board ground, wherein during testing, the device is positioned so that the substrate ground is electrically connected to the board ground; and
   a control system that is electrically coupled to the input conductive segment and the board ground, the control system directing a test current to one of the input conductive segment and the board ground to test the effectiveness of the grounding conductive segment including the first electrical interface.

2. The test assembly of claim 1 wherein the device further includes a stiffener positioned substantially between the heat spreader and the package substrate, wherein the first electrical interface is between the heat spreader and the stiffener, and wherein the grounding conductive segment further includes a second electrical interface between the stiffener and the package substrate, the control system directing a test current to one of the input conductive segment and the board ground to test the effectiveness of the grounding conductive segment including the first electrical interface and the second electrical interface.

3. The test assembly of claim 1 further comprising a plurality of spaced apart board pins, including a board ground pin that is electrically connected to the board ground, wherein during testing, the device is positioned so that the substrate ground is electrically connected to the board ground pin.

4. The test assembly of claim 3 further comprising an assembly body that is positioned substantially adjacent to the test board, the assembly body being adapted to receive the device, wherein the board ground pin extends through the assembly body.

5. The test assembly of claim 1 further comprising an assembly lid that is adapted to be pressed against the device, wherein the input conductive segment includes a first conductive segment that is positioned substantially within the assembly lid.

6. The test assembly of claim 5 further comprising an assembly body that is positioned substantially adjacent to the test board, the assembly body being adapted to receive the device, and wherein the input conductive segment further includes a second conductive segment that is positioned substantially within the assembly body, the second conductive segment being electrically connected to the first conductive segment.

7. The test assembly of claim 6 wherein the input conductive segment further includes a third conductive segment that is positioned substantially adjacent to the test board, the third conductive segment being electrically connected to the second conductive segment.

8. The test assembly of claim 5 wherein the assembly lid is a conductive plate.

9. The test assembly of claim 5 wherein the assembly lid is a substantially non-conductive plate that includes a conductive path that comprises the first conductive segment.

10. The test assembly of claim 1 wherein the control system measures the electrical connectivity of the test current to test the effectiveness of the grounding conductive segment including the first electrical interface.

11. The test assembly of claim 1 wherein the device includes an integrated circuit, and wherein the control system further tests the functionality of the integrated circuit.

12. A method for testing a device that includes a heat spreader, a package substrate having a substrate ground, and a grounding conductive segment that is designed to electrically connect the heat spreader to the substrate ground, the grounding conductive segment including a first electrical interface between the heat spreader and the package substrate, the method comprising the steps of:
   electrically connecting an input conductive segment to the heat spreader;
   positioning the device so that the substrate ground is electrically connected to a board ground of a test board;
   electrically coupling a control system to the input conductive segment and the board ground; and
   directing a test current to one of the input conductive segment and the board ground with the control system to test the effectiveness of the grounding conductive segment including the first electrical interface.

13. The method of claim 12 wherein the device further includes a stiffener positioned substantially between the heat spreader and the package substrate, wherein the first electrical interface is between the heat spreader and the stiffener, wherein the grounding conductive segment further includes a second electrical interface between the stiffener and the package substrate, and wherein the step of directing includes directing the test current to one of the input conductive segment and the board ground with the control system to test the effectiveness of the grounding conductive segment including the first electrical interface and the second electrical interface.

14. The method of claim 12 further comprising the step of electrically connecting a board ground pin to the board ground, and wherein the step of positioning includes positioning the device so that the substrate ground is electrically connected to the board ground pin.

15. The method of claim 12 further comprising the step of pressing an assembly lid against the device, and wherein the step of electrically connecting the input conductive segment includes the input conductive segment having a first conductive segment that is positioned substantially within the assembly lid.

16. The method of claim 15 further comprising the step of positioning an assembly body substantially adjacent to the test board, the assembly body being adapted to receive the device, and wherein the step of electrically connecting the input conductive segment includes the input conductive segment further having a second conductive segment that is positioned substantially within the assembly body, the second conductive segment being electrically connected to the first conductive segment.

17. The method of claim 16 wherein the step of electrically connecting the input conductive segment includes the input conductive segment further having a third conductive segment that is positioned substantially adjacent to the test board, the third conductive segment being electrically connected to the second conductive segment.

18. The method of claim 12 wherein the step of directing includes measuring the electrical connectivity of the test current with the control system to test the effectiveness of the grounding conductive segment including the first electrical interface.

19. The method of claim 12 wherein the device further includes an integrated circuit, and further comprising the step of testing the functionality of the integrated circuit with the control system.

20. A test assembly for testing a device that includes a heat spreader, a package substrate having a substrate ground, a stiffener positioned substantially between the heat spreader and the package substrate, an integrated circuit, and a grounding conductive segment including (i) a first electrical interface between the heat spreader and the stiffener and (ii) a second electrical interface between the stiffener and the package substrate, the test assembly comprising:

a test board having a board ground;

a plurality of spaced apart board pins, including a board ground pin that that is electrically connected to the board ground, wherein during testing, the device is positioned so that the substrate ground is electrically connected to the board ground pin;

an assembly body that is positioned substantially adjacent to the test board, the assembly body being adapted to receive the device, wherein the board ground pin extends through the assembly body;

an assembly lid that is adapted to be pressed against the device;

an input conductive segment that is electrically connected to the heat spreader, the input conductive segment including (i) a first conductive segment that is positioned substantially within the assembly lid, (ii) a second conductive segment that is positioned substantially within the assembly body, the second conductive segment being electrically connected to the first conductive segment, and (iii) a third conductive segment that is positioned substantially adjacent to the test board, the third conductive segment being electrically connected to the second conductive segment; and a control system that is electrically coupled to the input conductive segment and the board ground, the control system directing a test current to one of the input conductive segment and the board ground to test the effectiveness of the grounding conductive segment including the first electrical interface and the second electrical interface, and wherein the control system further tests the functionality of the integrated circuit.

\* \* \* \* \*